US012119354B2

(12) United States Patent
Dai et al.

(10) Patent No.: US 12,119,354 B2
(45) Date of Patent: Oct. 15, 2024

(54) ARRAY SUBSTRATE, ELECTRONIC DEVICE SUBSTRATE AND ELECTRONIC DEVICE

(71) Applicant: BOE TECHNOLOGY GROUP CO., LTD., Beijing (CN)

(72) Inventors: Qing Dai, Beijing (CN); Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 455 days.

(21) Appl. No.: 17/629,250

(22) PCT Filed: Feb. 2, 2021

(86) PCT No.: PCT/CN2021/074851
§ 371 (c)(1),
(2) Date: Jan. 21, 2022

(87) PCT Pub. No.: WO2021/155783
PCT Pub. Date: Aug. 12, 2021

(65) Prior Publication Data
US 2022/0254815 A1 Aug. 11, 2022

(30) Foreign Application Priority Data
Feb. 3, 2020 (CN) .......................... 202010078779.4

(51) Int. Cl.
*H01L 27/12* (2006.01)
*H10K 59/121* (2023.01)
(Continued)

(52) U.S. Cl.
CPC ......... *H01L 27/124* (2013.01); *H10K 59/121* (2023.02); *H10K 59/131* (2023.02); *H10K 59/124* (2023.02); *H10K 59/126* (2023.02)

(58) Field of Classification Search
CPC .. H01L 27/124; H10K 59/121; H10K 59/131; H10K 59/124; H10K 59/126; H10K 59/1213; H10K 71/621
See application file for complete search history.

(56) References Cited

U.S. PATENT DOCUMENTS

2008/0231168 A1 9/2008 Choi
2009/0044164 A1 2/2009 Lee
(Continued)

FOREIGN PATENT DOCUMENTS

CN 1869781 A 11/2006
CN 101271919 A 9/2008
(Continued)

OTHER PUBLICATIONS

The First Office Action for Chinese Patent Application No. 202010078779.4 issued by the Chinese Patent Office on Nov. 25, 2021.
(Continued)

*Primary Examiner* — David Vu
(74) *Attorney, Agent, or Firm* — IP & T GROUP LLP

(57) ABSTRACT

Provided is an array substrate, comprising a plurality of opening regions. The array substrate further comprises a substrate and at least one functional layer stacked on one side of the substrate. The functional layer comprises a plurality of functional patterns and at least one supplementary pattern, the plurality of functional patterns are configured to transmit electrical signals, and there is a gas region between the plurality of functional patterns; the at least one supplementary pattern is at least provided in at least one opening region, and the supplementary pattern is located in the gap region between the plurality of functional patterns. The plurality of functional patterns and the at least one supplementary pattern are spaced apart, and the plurality of (Continued)

functional patterns and the at least one supplementary pattern are arranged at substantially equal intervals.

19 Claims, 11 Drawing Sheets

(51) Int. Cl.
*H10K 59/124* (2023.01)
*H10K 59/131* (2023.01)
*H10K 59/126* (2023.01)

(56) References Cited

U.S. PATENT DOCUMENTS

| | | |
|---|---|---|
| 2016/0370945 A1 | 12/2016 | Qu |
| 2018/0233703 A1 | 8/2018 | Lee et al. |
| 2019/0165072 A1 | 5/2019 | Wang |
| 2021/0210560 A1 | 7/2021 | Tian et al. |
| 2021/0336166 A1 | 10/2021 | Wen |

FOREIGN PATENT DOCUMENTS

| | | |
|---|---|---|
| CN | 101364595 A | 2/2009 |
| CN | 104571720 B | 7/2017 |
| CN | 107732031 A | 2/2018 |
| CN | 107818988 A | 3/2018 |
| CN | 109244114 A | 1/2019 |
| CN | 109801954 A | 5/2019 |
| CN | 110571239 A | 12/2019 |

OTHER PUBLICATIONS

The Second Office Action for Chinese Patent Application No. 202010078779.4 issued by the Chinese Patent Office on May 7, 2022.

ARRAY SUBSTRATE, ELECTRONIC DEVICE SUBSTRATE AND ELECTRONIC DEVICE

CROSS-REFERENCE TO RELATED APPLICATIONS

This application is a national phase entry under 35 USC 371 of International Pat. Application No. PCT/CN 2021/074851 filed on Feb. 2, 2021, which claims priority to Chinese Patent Application No. 202010078779.4, filed on Feb. 3, 2020, which are incorporated herein by reference in their entirety.

TECHNICAL FIELD

The present disclosure relates to the field of display technologies, and in particular, to an array substrate, an electronic device substrate and an electronic device.

BACKGROUND

With the rapid development of display technologies, electronic devices have gradually come throughout people's lives. The electronic devices usually include, for example, photodetection devices, organic light-emitting diode (OLED) display devices, and light-emitting diode (LED) display devices. These electronic devices are devices with precise manufacturing specifications, and the manufacturing specifications thereof have an important influence on the operating performances of the electronic devices.

SUMMARY

In an aspect, an array substrate is provided. The array substrate has a plurality of opening regions. The array substrate includes a base and at least one functional layer. The at least one functional layer is disposed on a side of the base. A functional layer in the at least one functional layer includes a plurality of functional patterns and at least one supplementary pattern. The plurality of functional patterns are configured to transmit electrical signals, and a gap region exists between the plurality of functional patterns. The at least one supplementary pattern is at least disposed in at least one opening region, and a supplementary pattern in the at least one supplementary pattern is located in the gap region between the plurality of functional patterns. The plurality of functional patterns and the at least one supplementary pattern are spaced apart from each other, and the plurality of functional patterns and the at least one supplementary pattern are arranged at substantially equal intervals.

In some embodiments, the at least one supplementary pattern is further disposed in a region other than the plurality of opening regions.

In some embodiments, one supplementary pattern is disposed in a gap region between two adjacent functional patterns, and intervals between the supplementary pattern and the functional patterns on two sides of the supplementary pattern are substantially equal.

In some embodiments, a plurality of supplementary patterns are disposed in a gap region between two adjacent functional patterns, and the plurality of supplementary patterns are arranged at substantially equal intervals. An interval between a functional pattern and a supplementary pattern that are adjacent to each other is substantially equal to an interval between two adjacent supplementary patterns.

In some embodiments, the plurality of functional patterns and the at least one supplementary pattern are arranged at substantially equal intervals in a first direction and/or a second direction along a plane where the base is located. The first direction and the second direction intersect.

In some embodiments, a numerical range of an interval between a functional pattern and a supplementary pattern that are adjacent to each other is 4 µm to 10 µm. In a case where the functional layer includes a plurality of supplementary patterns, and a numerical range of an interval between two adjacent supplementary patterns is 4 µm to 10 µm.

In some embodiments, the plurality of functional patterns and the at least one supplementary pattern are made of a same material.

In some embodiments, in a direction perpendicular to the base, a thickness of each of the plurality of functional patterns is equal to a thickness of the supplementary pattern.

In some embodiments, the supplementary pattern is in any one of a long strip shape, a circular shape and a rhombic shape.

In some embodiments, a plurality of supplementary patterns exist. The plurality of functional patterns are each in the long strip shape, and the supplementary patterns are each in the long strip shape. The plurality of functional patterns and the plurality of supplementary patterns all extend in a first direction, and in a second direction, the plurality of functional patterns and the plurality of the supplementary patterns are arranged at substantially equal intervals. Or, the plurality of functional patterns and the plurality of the supplementary patterns all extend in the second direction, and in the first direction, the plurality of functional patterns and the plurality of the supplementary patterns are arranged at substantially equal intervals. The first direction and the second direction intersect along a plane where the base is located.

In some embodiments, the plurality of functional patterns include at least one first functional pattern. A first functional pattern in the at least one first functional pattern includes a first portion in an opening region in the plurality of opening regions and a second portion outside the opening region. The first portion includes a plurality of strip-shaped sub-patterns, and an end of each of the plurality of strip-shaped sub-patterns is connected to the second portion.

In some embodiments, the plurality of strip-shaped sub-patterns are parallel to each other and arranged at equal intervals.

In some embodiments, a numerical range of an interval between two adjacent strip-shaped sub-patterns is 4 µm to 10 µm.

In some embodiments, the array substrate further includes a semiconductor layer, a gate insulating layer, a gate metal layer, an interlayer insulating layer, and a source-drain metal layer. The semiconductor layer is disposed on the side of the base, and the semiconductor layer includes active layers of a plurality of thin film transistors. The gate insulating layer is disposed on a side of the active layers away from the base. The gate metal layer is disposed on a side of the gate insulating layer away from the base, and the gate metal layer includes a plurality of gate lines and gates of the plurality of thin film transistors. The interlayer insulating layer is disposed on a side of the gate metal layer away from the base. The source-drain metal layer is disposed on a side of the interlayer insulating layer away from the base, and the source-drain metal layer includes a plurality of data lines, and sources and drains of the plurality of thin film transistors. The at least one functional layer includes the semiconductor layer, and the plurality of functional patterns include the active layers. And/or, the at least one functional layer includes the gate metal layer, and the plurality of functional patterns include the plurality of gate lines and the gates of the plurality of thin film transistors. And/or, the at least one functional layer includes the source-drain metal layer, and the plurality of functional patterns include the plurality of data lines, and the sources and drains of the plurality of thin film transistors.

In some embodiments, the array substrate further includes a light-shielding metal layer and a first insulating layer. The light-shielding metal layer is disposed between the base and the semiconductor layer. The first insulating layer is disposed between the base and the semiconductor layer. The light-shielding metal layer is closer to the base than the first insulating layer.

The light-shielding metal layer includes a plurality of light-shielding patterns, and each light-shielding pattern corresponds to an active layer in the active layers. The at least one functional layer further includes the light-shielding metal layer, and the plurality of functional patterns include the plurality of light-shielding patterns.

In another aspect, an electronic device substrate is provided. The electronic device substrate includes the array substrate in any of the above embodiments and a plurality of driving devices. The plurality of driving devices are disposed on the array substrate, and each driving device includes a first electrode, a driving layer and a second electrode that are stacked. An orthographic projection of the driving layer in each driving device on the base is within an opening region in the plurality of opening regions.

In some embodiments, the driving device includes a light-emitting device, and the driving layer includes a light-emitting layer. Or, the driving device includes a photoelectric conversion device, and the driving layer includes a photoelectric conversion layer.

In yet another aspect, an electronic device is provided. The electronic device includes the electronic device substrate in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings.

DETAILED DESCRIPTION

Figure 1:
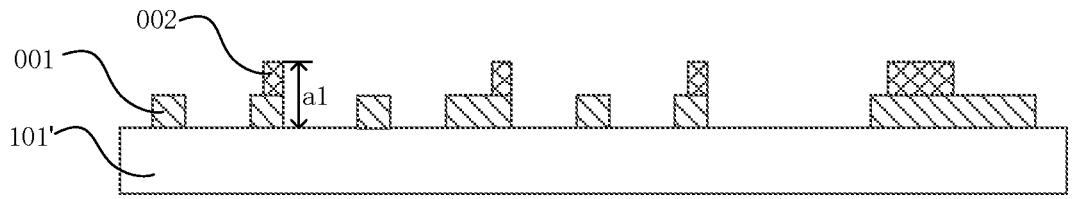
FIG. 1 is a sectional view of an underlying substrate, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", "specific example", and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

"First", "second" and similar words used in the present disclosure are not intended to indicate any order, quantity or importance, but are merely used to distinguish different components. In the description of the embodiments of the present disclosure, "a plurality of/the plurality of" means two or more unless otherwise specified. "Include", or "comprise", or other similar word means that an element or object preceding this word includes element(s) or object(s) listed after this word and equivalents thereof, but does not exclude other elements or objects. "Connected", or "coupled", or other similar word is not limited to a physical or mechanical connection, but may include an electrical connection, whether direct or indirect. The terms such as "upper", "lower", "left", "right" are only used to indicate relative positional relationships, and when an absolute position of a described object changes, the relative positional relationship may also be changed accordingly. "About", "substantially", or "approximately" includes a stated value and an average value within an acceptable range of deviation of a particular value determined by a person of ordinary skilled in the art, considering measurement in question and errors associated with measurement of a particular quantity (i.e., limitations of a measurement system).

The phrase "at least one of A, B and C" has the same meaning as the phrase "at least one of A, B or C", both including the following combinations of A, B and C: only A, only B, only C, a combination of A and B, a combination of A and C, a combination of B and C, and a combination of A, B and C. The phrase "A and/or B" includes the following three combinations: only A, only B, and a combination of A and B.

The use of "applicable to" or "configured to" in the present disclosure means as open and inclusive expression, which does not exclude devices that are applicable to or configured to perform additional tasks or steps. Exemplary embodiments are described in the present disclosure with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown in the present disclosure, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

It will be noted that the embodiments and features of the embodiments in the present disclosure may be combined with each other without conflict. Hereinafter, the to present disclosure will be described in detail with reference to the accompanying drawings by combining the embodiments.

An electronic device such as an organic electronic thin film device apparatus usually includes, for example, transistor circuits and driving devices correspondingly electrically connected to the transistor circuits. For example, the driving device includes a light-emitting device and a photoelectric sensing element. Microscopically, these transistor circuits or driving devices are usually composed of a plurality of inorganic (e.g., various metals, semiconductors, insulating media) material thin films and organic material thin films, and some thin films are patterned, and usually include a plurality of patterns. For example, the plurality of patterns are linear, blocky, or strip-shaped. Hereinafter, a film layer with a plurality of patterns is referred to as a functional layer, and other thin film (e.g., an insulating layer) is not patterned, and this thin film is laid in whole layer without including a plurality of patterns. The patterns of a plurality of functional layers are overlapped with each other in physical space. That is, a plurality of thin films have differences in overall thickness in different regions due to different numbers of overlapped patterns in different regions, so that a non-uniform film layer thickness and a poor flatness occur.

A plurality of film layers corresponding to the transistor circuits constitute an underlying substrate, and a plurality of film layers corresponding to the driving devices constitute an upper substrate, and the upper substrate is disposed on the underlying substrate. In a case of the underlying substrate with a poor flatness, each film layer in the upper substrate also exhibits obvious unevenness. Some driving devices have high requirements for the surface flatness of the underlying substrate. If a surface of the underlying substrate is uneven, the operating effect of the driving device is seriously affected. For example, for the light-emitting device, the thickness of a film layer such as a light-emitting layer included in the light-emitting device is small, usually within a range of 20 to 100 nm, so that a flatness of the film layer such as the light-emitting layer is greatly affected by the flatness of the underlying substrate, and thus a luminance and a luminous uniformity of the light-emitting device are affected by an uneven surface of the underlying substrate.

In the underlying substrate, the plurality of patterns included in each functional layer are unevenly distributed in the horizontal latitude, so that a level difference of each portion is different after the plurality of film layers are stacked. For example, in the related art, as shown in FIG. 1, the underlying substrate includes a base 101', a first pattern layer 001, and a second pattern layer 002. The first pattern layer 001 and the second pattern layer 002 are the functional layers, both including the plurality of patterns. The first pattern layer 001 and the second pattern layer 002 may further include other film layer(s) such as the insulating layer(s) or other functional layer(s) therebetween, which are not shown in the figures, and only the main functional layers causing differences in thickness are shown for emphasis. In FIG. 1, a level difference between a highest point of stacked patterns of the first pattern layer 001 and the second pattern layer 002 and the base 101' is a1.

Figure 2:
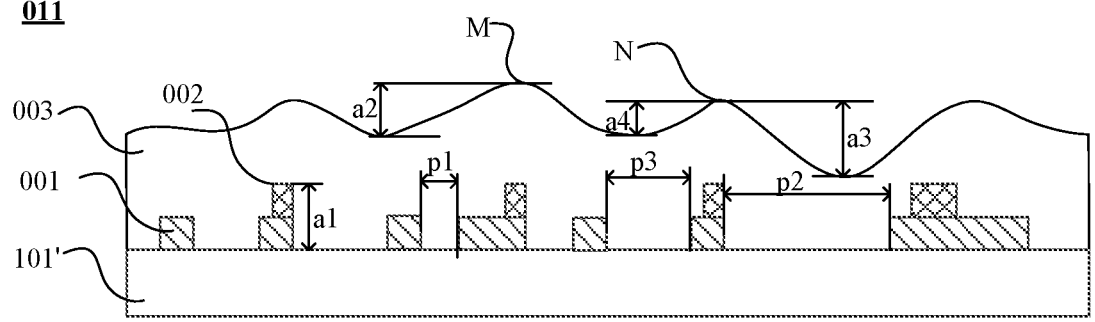
FIG. 2 is a sectional view of an underlying substrate coated with a planarization layer, in accordance with some embodiments.

As shown in FIG. 2, the plurality of stacked thin films in the underlying substrate are planarized to facilitate a subsequent process. At present, a common method is to coat a photoresist thin film on a surface of the plurality of stacked thin films by using a coating method, and to planarize the photoresist film by using a levelling property of a liquid medium (which forms a thin film after being dried and cured) to form a planarization layer 003. However, in a case where the level difference a1 before planarization is large, the single-layer photoresist thin film is difficult to meet a planarization requirement, and a photoresist film with a sufficient thickness is required to achieve a certain planarization requirement, which not only increases the difficulty of the subsequent process, but also does not meet the development trend of thinning the electronic device. As shown in FIG. 2, after the planarization layer 003 is manufactured on surfaces of the first pattern layer 001 and the second pattern layer 002, it can be seen that certain height differences still exist on a surface of the planarization layer 003, and this surface is non-uniform.

Referring to FIG. 2 again, it is found through research that a position where the level difference between the stacked patterns and the base is largest is not necessarily a highest position of the planarization layer 003, and the highest position of the planarization layer 003 is in a region where the patterns are dense. As shown in FIG. 2, before the planarization layer 003 is formed, a highest point of the underlying substrate is at a position where the patterns of the first pattern layer 001 and the second pattern layer 002 are stacked, a level difference between the highest point and the base is marked as a1, and there are four highest positions with the level difference of a1. However, after the planarization is performed, the surface of the planarization layer 003 has a plurality of high points and a plurality of low points, and exhibits a height fluctuation. A level difference between a highest point M and a low point around the highest point M is a2, a level difference between a high point N and a low point around the high point N is a3, and a3 is greater than a2. It can be seen that the level difference of the highest point M is in a middle region where the patterns are dense. In a place where the patterns are sparse, i.e., in a case where two patterns are far apart, a large gap exists, and the planarization layer has a lowest point at the gap.

Referring to FIG. 2 again, before a material of the planarization layer is coated, in a direction perpendicular to the base 101', an initial level difference is a height of the first pattern layer 001 relative to the base 101', or a height of a position where the first pattern layer 001 and the second pattern layer 002 are stacked relative to the base 101'. A numerical range of the initial level difference is 1.0 to 1.5 μm. After the material of the planarization layer is coated, the thickness of the planarization layer 003 is about 2.5 μm. The level differences after planarization are different for different wiring intervals P1, P2, and P3, where P1 is less than P3, and P3 is less than P2 (i.e., P1<P3<P2). When P2 is greater than 20 μm (i.e., P2>20 μm), the corresponding level difference a3 after planarization is large, and a3 is greater than 300 nm (i.e., a3>300 nm). When P3 is greater than 12 μm and less than 20 μm (i.e., 12 μm<P3<20 μm), a corresponding level difference a4 after planarization is greater than 150 nm and less than 300 nm (i.e., 150 nm<a4<300 nm). When P1 is greater than 5 μm and less than 12 μm (i.e., 5 μm<P1<12 μm), the corresponding level difference a2 after planarization is less than 150 nm (i.e., a2<150 nm). Of course, the above values of the planarization effects are not absolute, but are only indicative of relative magnitude. The values are also affected by the type and thickness of the material of the planarization layer, and wiring patterns on an adjacent periphery of the wiring intervals.

In addition to the above, the functional layer in the underlying substrate further includes a blocky pattern with a large area, such as the rightmost pattern in FIG. 1 or FIG. 2. After the material of the planarization layer is coated, a high accumulation is formed in a center of the blocky pattern with a large area, so that compared to other peripheral thin film pattern with a small area that is coated with the material of the planarization layer, the blocky pattern with a large area that is coated with the material of the planarization layer has a higher height and a relatively large level difference.

Since a wet coating method is used in an existing planarization process, that is, the planarization is performed by using the levelling property of a liquid material, and the levelling property of the material is related to shapes and areas of underlying patterns, in a place having a large level difference and dense patterns and in a place having the underlying patterns with large areas, a great amount of material of the planarization layer may be stacked, and the height after planarization is high. In a place having sparse patterns, an area ratio of high positions in this region is small, so that the material of the planarization layer cannot be effectively remained at the high positions, and thus the film thickness in this place is small. Therefore, the flatness of the formed planarization layer is directly affected by the sparsity and the areas of the underlying patterns before planarization.

According to existing materials of the planarization layer and process capabilities, the planarization of the underlying substrate is improved by simply using a planarization process, which cannot meet performance requirements of the subsequent process/device. Therefore, some embodiments of the present disclosure provide a solution for changing the patterns of the functional layer. That is, the patterns are improved from a design perspective, so as to improve the planarization performance of the planarization layer.

Figure 4:
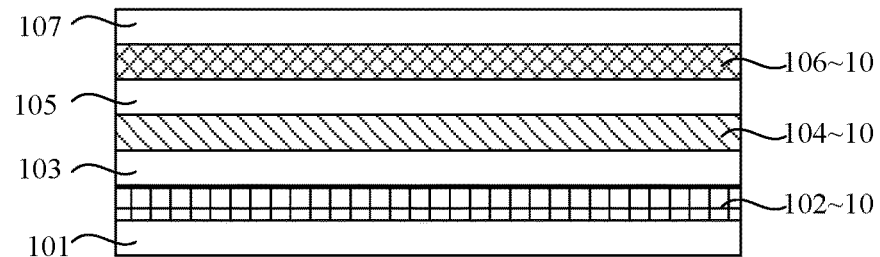
FIG. 4 is a sectional view of an electronic device substrate, in accordance with some embodiments.

Referring to FIGS. 4 to 8B, based on the above analysis, some embodiments of the present disclosure provide an array substrate 100. As shown in FIG. 4, the array substrate 100 includes a base 101, at least one functional layer 10 disposed on a side of the base 101, and a planarization layer 107 disposed on a side of the at least one functional layer 10 away from the base 101. A flatness of the planarization layer 107 is to improved by designing patterns included in the functional layer(s) 10. For convenience of description, an electronic device substrate 011 and an electronic device 01 to which the array substrate 100 is applied will be introduced first.

It will be noted that the sectional view of the array substrate 100 shown in FIG. 4 is to illustrate film layers included in the array substrate 100, and is not an actual structure of the array substrate 100. In some examples, the functional layer 10 includes various patterns, and is not arranged as a whole layer in the figure.

Figure 3:
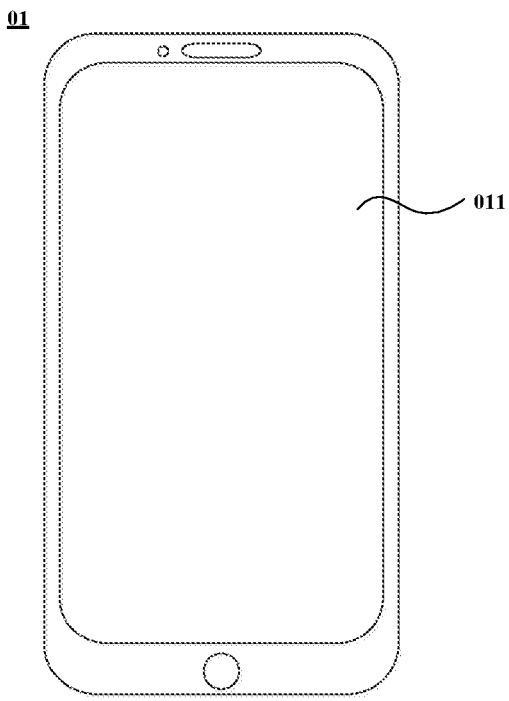
FIG. 3 is a view showing an electronic device, in accordance with some embodiments.

As shown in FIG. 3, some embodiments of the present disclosure provide the electronic device 01. The electronic device 01 is, for example, the organic electronic thin film device apparatus. In some examples, the display device 01 includes a frame, the electronic device substrate 011 disposed in the frame, a circuit board, and other electronic accessories.

Figure 5:
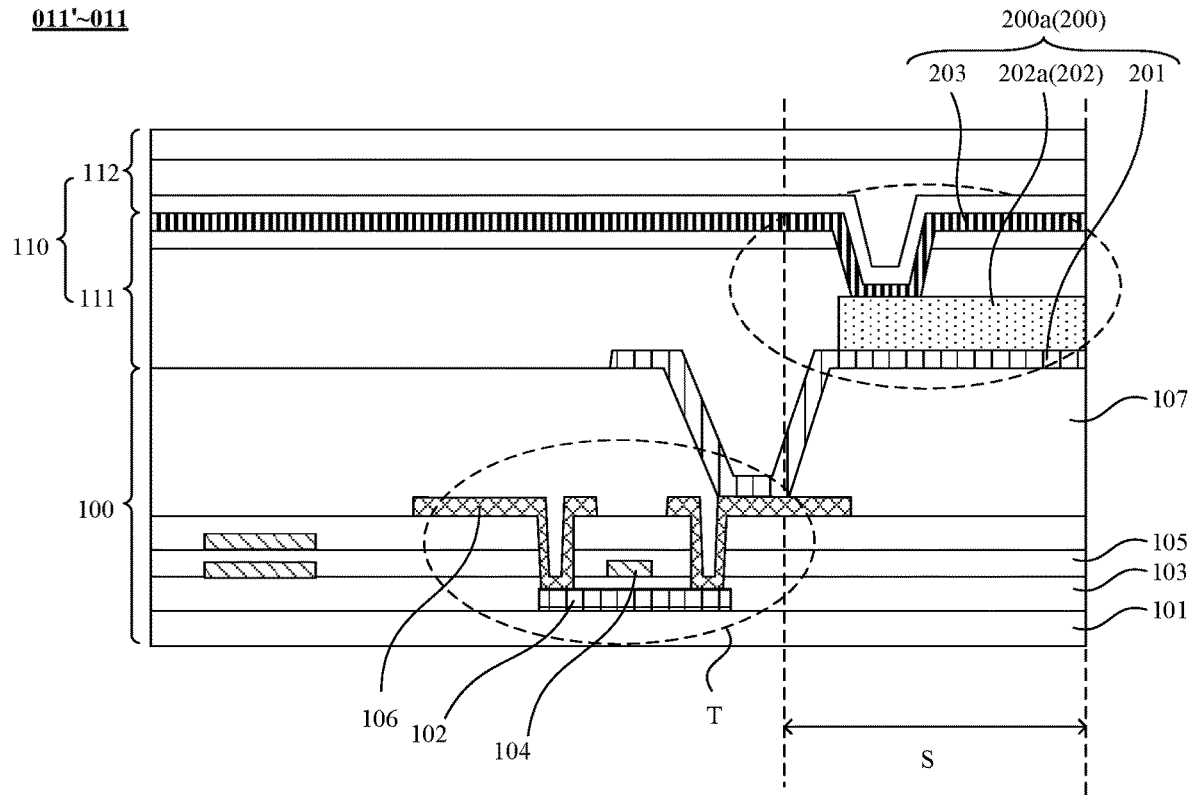
FIG. 5 is a sectional view of another electronic device substrate, in accordance with some embodiments.
Figure 6:
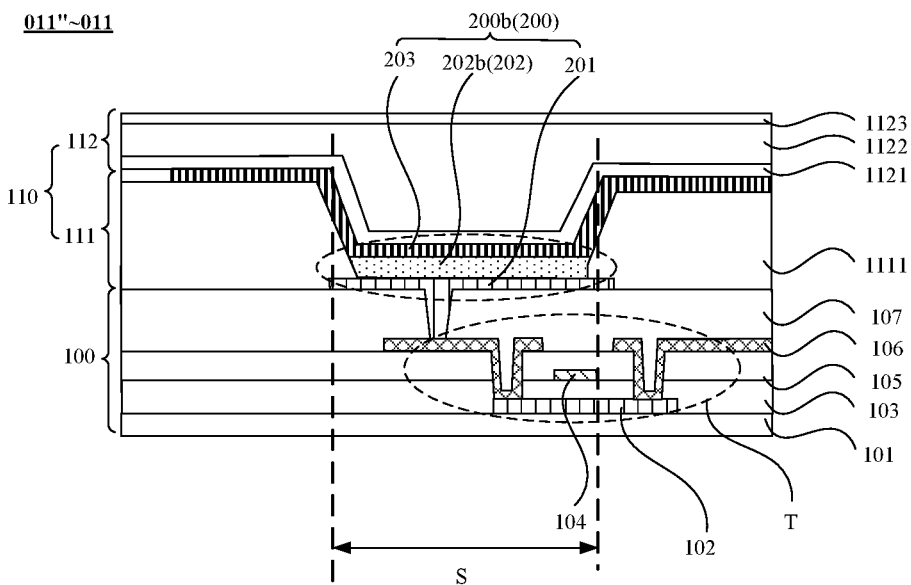
FIG. 6 is a sectional view of yet another electronic device substrate, in accordance with some embodiments.
Figure 7:
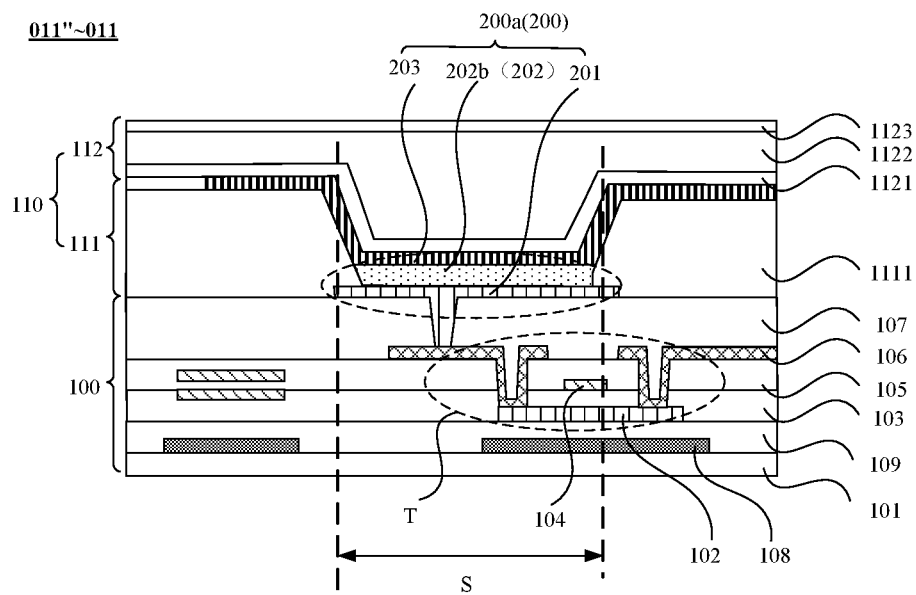
FIG. 7 is a sectional view of yet another electronic device substrate, in accordance with some embodiments.

As shown in FIGS. 5 to 7, the electronic device substrate 011 includes an underlying substrate and an upper substrate 110. The underlying substrate is, for example, the array substrate 100, and the upper substrate 110 includes a plurality of driving devices 200. It can be understood that the electronic device substrate includes the array substrate and the plurality of driving devices disposed on the array substrate.

For example, as shown in FIG. 5, the electronic device 01 in some embodiments of the present disclosure is a flat panel detector, and the electronic device substrate 011 is a flat panel detection substrate 011'.

The flat panel detection substrate 011' includes the array substrate 100 and the plurality of driving devices 200 disposed on the array substrate 100. The driving device 200 is, for example, a photoelectric conversion device 200a. Each driving device 200 includes a first electrode 201, a driving layer 202, and a second electrode 203 that are stacked. The driving layer 202 includes a photoelectric conversion layer 202a. Each driving device 200 is disposed on the planarization layer 107.

In some embodiments, the array substrate 100 includes a plurality of driving circuits. For example, each driving circuit includes at least two thin film transistors T. Each driving circuit is electrically connected to the photoelectric conversion device 200a, and is configured to drive the photoelectric conversion device 200a to perform a photoelectric conversion, thereby realizing a detection function.

Referring to FIG. 5 again, in the array substrate 100, in a direction perpendicular to the base 101, a region corresponding to the photoelectric conversion layer 202a of the photoelectric conversion device 200a is referred to as an opening region S, so that the array substrate 100 has a plurality of opening regions S. For example, the plurality of opening regions S are arranged in an array, and an orthographic projection of the driving layer 202 in each driving device 200 on the base 101 is within the opening region S. For example, an orthographic projection of the photoelectric conversion layer 202a in each photoelectric conversion device 200a on the base 101 is within the opening region S.

For the flat panel detection substrate 011', since the photoelectric conversion layer 202a is very thin, the photoelectric conversion layer 202a is sensitive to a surface flatness of the underlying substrate. If a surface of the planarization layer 107 in the array substrate 100 is uneven, a surface of the driving layer 202 on the planarization layer 107 is uneven, which results in an inaccurate detection result of a flat panel detection device, thereby seriously affecting product performance. Therefore, a surface flatness of the planarization layer 107 of the array substrate 100 is required to be improved, and particularly, for the plurality of opening regions S of the array substrate 100, a high flatness of the planarization layer 107 is required to ensure that the driving device 200 is able to operate normally.

For example, the electronic device in some embodiments of the present disclosure is a display device. The display device may be, for example, a flat panel detection device, an OLED display device, an LED display device, a micro organic light-emitting diode (Micro OLED) display device, a quantum dot light-emitting diode (QLED) display device, a mini light-emitting diode (Mini LED) display device, or a micro light-emitting diode (Micro LED) display device. The electronic device substrate 011 is a display substrate 011". Hereinafter, the introduction will be made in an example where the electronic device is the OLED display device, and the electronic device substrate is an OLED display substrate.

As shown in FIG. 6, the electronic device substrate 011 (OLED display substrate) includes the array substrate 100 and the plurality of driving devices 200 disposed on the array substrate 100. The driving device 200 is, for example, a light-emitting device 200b. Each driving device 200 includes a first electrode 201, a driving layer 202, and a second electrode 203 that are stacked. The driving layer 202 includes, for example, a light-emitting layer 202b.

Figure 8A:
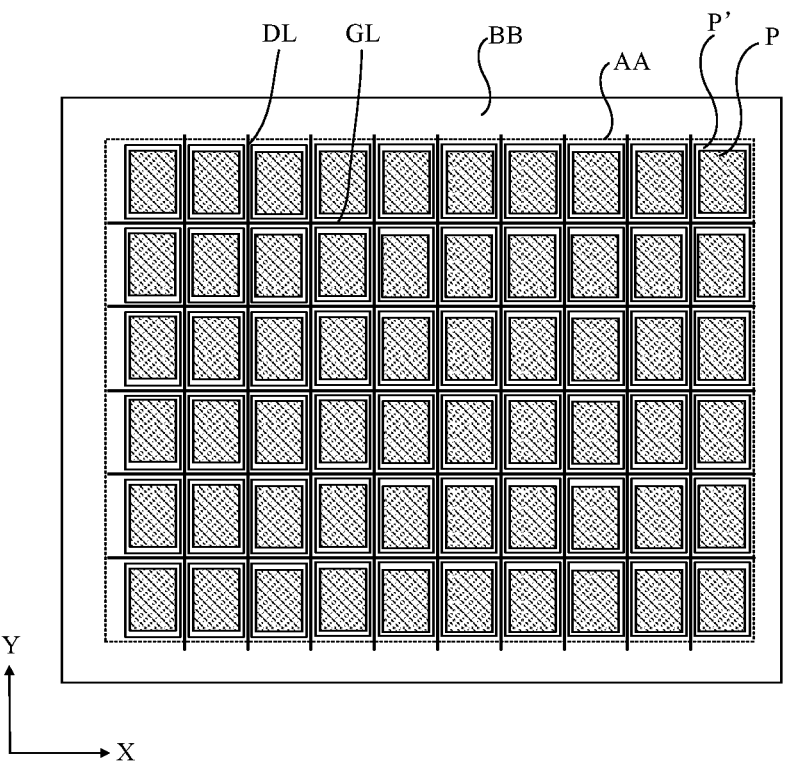
FIG. 8A is a plan view of a display panel, in accordance with some embodiments.

As shown in FIG. 8A, in some embodiments, the display substrate 011" includes a display region AA and a peripheral region BB. A plurality of sub-pixels P, a plurality of gate lines GL, and a plurality of data lines DL are provided in the display region AA. For example, the plurality of sub-pixels P are arranged in an array, the plurality of gate lines GL extend in a first direction X, and the plurality of data lines DL extend in a second direction Y. Each gate line GL is electrically connected to sub-pixels P in a row, and each data line DL is electrically connected to sub-pixels P in a column. Each sub-pixel P includes a driving circuit and the light-emitting device. Each driving circuit is electrically connected to the light-emitting device, and is configured to drive the light-emitting device to emit light, thereby realizing display. For example, a region where each sub-pixel P is located is referred to as a sub-pixel region P'. The display region AA may be divided into a plurality of sub-pixel regions P', and each sub-pixel region P' is provided with the light-emitting device.

As shown in FIG. 6, in some examples, the electronic device substrate 011 further includes the upper substrate 110 disposed on the array substrate 100, and the upper substrate 110 includes a driving device layer 111 and an encapsulation layer 112. For example, the driving device layer 111 includes a first electrode layer, a light-emitting film layer, a second electrode layer, and a pixel defining layer 1111. The first electrode layer is disposed on a side of the planarization layer 107 in the array substrate away from the base 101, and the first electrode layer includes a plurality of first electrodes 201. The pixel defining layer 1111 is disposed on a side of the first electrode layer away from the base 101. A plurality of openings are disposed in the pixel defining layer 1111, and each opening exposes at least one portion of the first electrode 201. The light-emitting film layer is disposed on the side of the first electrode layer away from the base 101. The light-emitting film layer includes a plurality of light-emitting layers 202b, and each light-emitting layer 202b is located in the opening. The second electrode layer is disposed on a side of the light-emitting layers 202b and the pixel defining layer 1111 away from the base 101.

Each light-emitting device 200 includes the first electrode 201 electrically connected to the driving circuit, the light-emitting layer 202b, and a portion (i.e., the second electrode 203) of the second electrode layer corresponding to the light-emitting layer.

In some embodiments, the driving layer 202 may be of a single-layer structure. For example, the driving layer 202 in the OLED display device only includes the light-emitting layer 202b disposed between the first electrode 201 and the second electrode 203. The driving layer 202 may also be of a multi-layer structure. For example, the driving layer 202 includes a hole injection layer, a hole transporting layer, the light-emitting layer, an electron transporting layer and an electron injection layer that are stacked between the first electrode 201 and the second electrode 203. The first electrode 201 may be an anode or a cathode. When the first electrode 201 is the anode, the corresponding second electrode 203 is the cathode. When the first electrode 201 is the cathode, the corresponding second electrode 203 is the anode.

In some embodiments, the encapsulation layer 112 includes a plurality of inorganic thin film layers and at least one organic thin film layer that are stacked, which may be of a typical "sandwich" structure, including an inorganic thin film layer 1121, an organic thin film layer 1122 and an inorganic thin film layer 1123 that are stacked in sequence. The encapsulation layer 112 may also be a first inorganic thin film layer, a second inorganic thin film layer, an organic thin film layer, a third inorganic thin film layer, and a fourth inorganic thin film layer that are stacked in sequence.

Figure 8B:
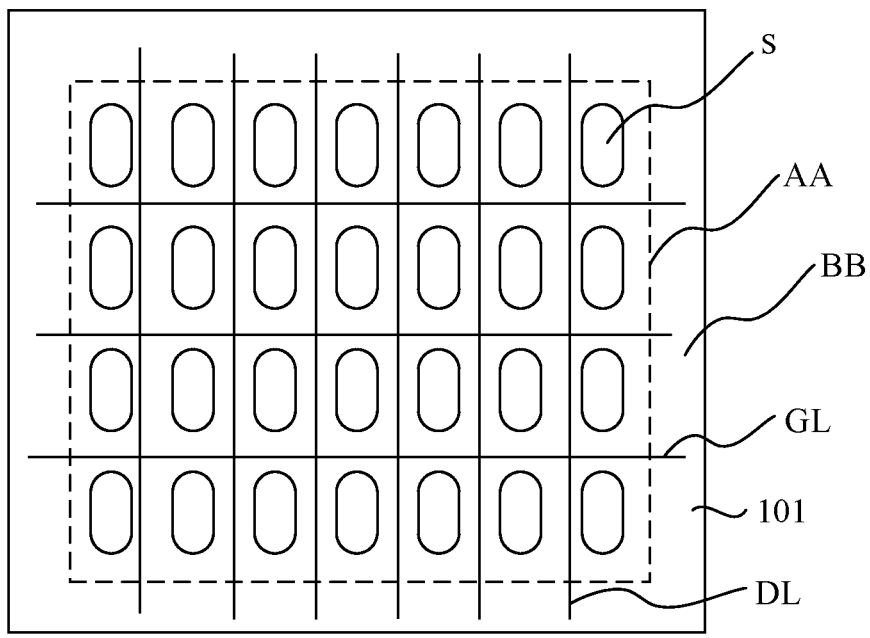
FIG. 8B is a plan view of an array substrate, in accordance with some embodiments.

As shown in FIGS. 6 and 7, in the array substrate 100, in the direction perpendicular to the base 101, a region corresponding to each opening defined by the pixel defining layer 1111 is referred to as an opening region S. For example, from a top view of the display substrate 011", a shape of the opening region S is consistent with a shape of the opening, for example, both are oval or rhombic. As shown in FIG. 8B, the array substrate 100 has a plurality of opening regions S. For example, the plurality of opening regions S are arranged in an array, and each opening region S is within the sub-pixel region P'. An orthographic projection of the driving layer 202 in each driving device 200 on the base 101 is within the opening region S.

For the OLED display substrate, the light-emitting layer is usually very thin, which has high requirements for the surface flatness of the planarization layer in the array substrate. In particular, for the plurality of opening regions S in the array substrate 100, a high flatness is required to ensure that the driving device 200 is able to operate normally. If the surface of the planarization layer away from the base is uneven, a highest point and a lowest point have a large level difference therebetween, so that surfaces of the light-emitting layers in the light-emitting devices are uneven, which results in a non-uniform luminescence of the OLED display substrate, thereby seriously affecting the display quality.

Considering the OLED display device as an example, the array substrate in the OLED display device will be described in following embodiments of the present disclosure. Of course, a structure of the array substrate introduced below may also be applicable to the array substrate in the flat panel detector.

As shown in FIGS. 6 and 8B, the array substrate 100 includes the display region AA and the peripheral region BB, and the plurality of opening regions S are disposed in the display region AA. The array substrate 100 includes the plurality of driving circuits, the plurality of gate lines GL and the plurality of data lines DL. Each driving circuit includes at least two thin film transistors T. In some embodiments, the driving circuit further includes capacitor(s).

The orthographic projection of the driving layer 202 in each driving device 200 on the base 101 is within the opening region S.

As shown in FIGS. 4 and 6, the array substrate 100 includes the base 101 and the at least one functional layer disposed on the side of the base 101. In a case where the at least one functional layer 10 includes a plurality of functional layers 10, the plurality of functional layers are stacked, and two adjacent functional layers 10 are insulated from each other.

In some embodiments, the array substrate 100 further includes the base 101, a semiconductor layer 102, a gate insulating layer 103, a gate metal layer 104, an interlayer insulating layer 105 and a source-drain metal layer 106 that are stacked in sequence. The semiconductor layer 102 is disposed on the side of the base 101, and the semiconductor layer 102 includes active layers of a plurality of thin film transistors T. The gate insulating layer 103 is disposed on a side of the semiconductor layer 102 away from the base 101. The gate metal layer 104 is disposed on a side of the gate insulating layer 103 away from the base 101, and the gate metal layer 104 includes the plurality of gate lines GL and gates of the plurality of thin film transistors T. The interlayer insulating layer 105 is disposed on a side of the gate metal layer 104 away from the base 101. The source-drain metal layer 106 is disposed on a side of the interlayer insulating layer 105 away from the base 101, and the source-drain metal layer 106 includes the plurality of data lines DL, and sources and drains of the plurality of thin film transistors T. The functional layer(s) 10 may include at least one of the semiconductor layer 102, the gate metal layer 104 and the source-drain metal layer 106. For example, the at least one functional layer 10 includes the semiconductor layer 102. And/or, the at least one functional layer 10 includes the gate metal layer 104. And/or, the at least one functional layer 10 includes the source-drain metal layer 106.

As shown in FIG. 7, in a case where the array substrate 100 further includes a light-shielding metal layer 108 and a first insulating layer 109 that are stacked in sequence between the base 101 and the semiconductor layer 102, the functional layer(s) 10 further include the light-shielding metal layer 108. The light-shielding metal layer 108 includes a plurality of light-shielding patterns, and each light-shielding pattern corresponds to the active layer of the thin film transistor T. Here, "correspond to" means that an orthographic projection of each light-shielding pattern on the base is at least partially overlapped with an orthographic projection of the active layer on the base.

The light-shielding metal layer 108 is configured to prevent external light from directly irradiating the active layers of the thin film transistors T, so as to avoid a decrease in conductivity of the active layer of the thin film transistor T due to the light irradiation. It will be understood that the light-shielding pattern of the light-shielding metal layer 108 may also be configured to protect performances of other electrical elements in the array substrate 100, e.g., to protect the storage performance of the capacitor.

In the solution in some embodiments of the present disclosure, the patterns included in the functional layer(s) 10 are designed, which means that the patterns of at least one of the semiconductor layer 102, the gate metal layer 104, the source-drain metal layer 106, and the light-shielding metal layer 108 are designed.

In some embodiments, as shown in FIGS. 11, 12, and 14 to 16, each functional layer 10 includes a plurality of functional patterns F and at least one supplementary pattern R. The plurality of functional patterns F are configured to transmit electrical signals, and gap region(s) K exist between the plurality of functional patterns F. The at least one supplementary pattern R is at least disposed in at least one opening region S, and the supplementary pattern R is located in the gap region K between the plurality of functional patterns F. That is, the gap region K between the plurality of functional patterns F includes sub-region(s) overlapped with the opening region(s) S and a sub-region non-overlapped with the opening region S. At least one supplementary pattern R is at least disposed in the sub-region overlapped with the opening region S in the gap region K between the plurality of functional patterns F.

The plurality of functional patterns F and the at least one supplementary pattern R are spaced apart from each other, and are arranged at substantially equal intervals. The plurality of functional patterns F and the at least one supplementary pattern R are not in contact with each other, and thus, even if the supplementary pattern(s) are additionally disposed in the functional layer 10, the function of the plurality of functional patterns F to transmit the electrical signals is not affected.

For example, the plurality of functional patterns F and the at least one supplementary pattern R are arranged at substantially equal intervals, which means that an interval between the functional pattern F and the supplementary pattern R that are adjacent to each other, or an interval between two adjacent supplementary patterns R is a constant value. Therefore, the plurality of functional patterns F and the at least one supplementary pattern R are uniformly distributed on a plane where the functional layer is located.

Figure 9:
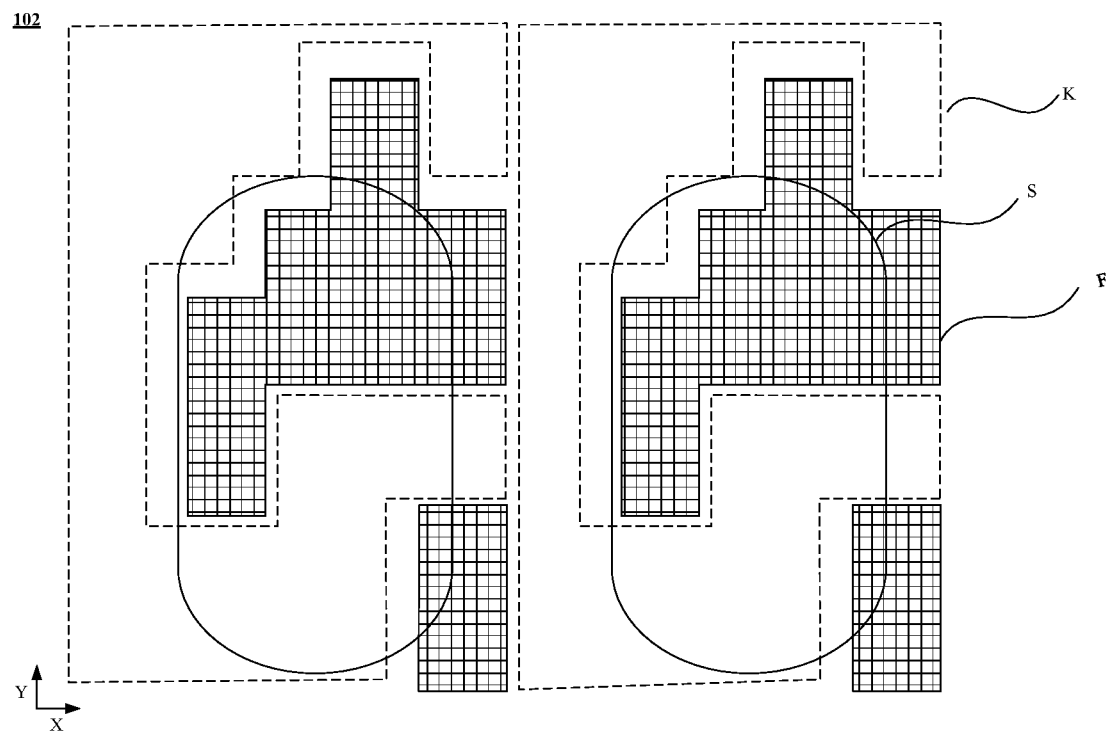
FIG. 9 is a partial plan view of a functional layer in an array substrate, in accordance with some embodiments.
Figure 10:
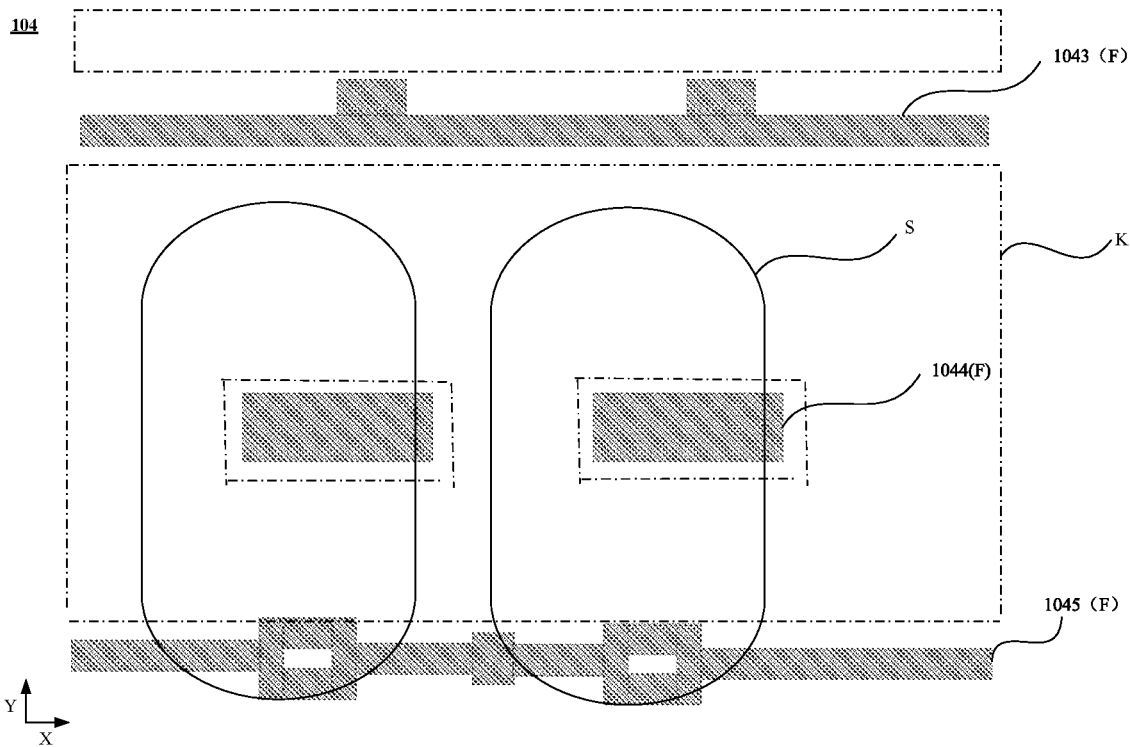
FIG. 10 is a partial plan view of another functional layer in an array substrate, in accordance with some embodiments.
Figure 13:
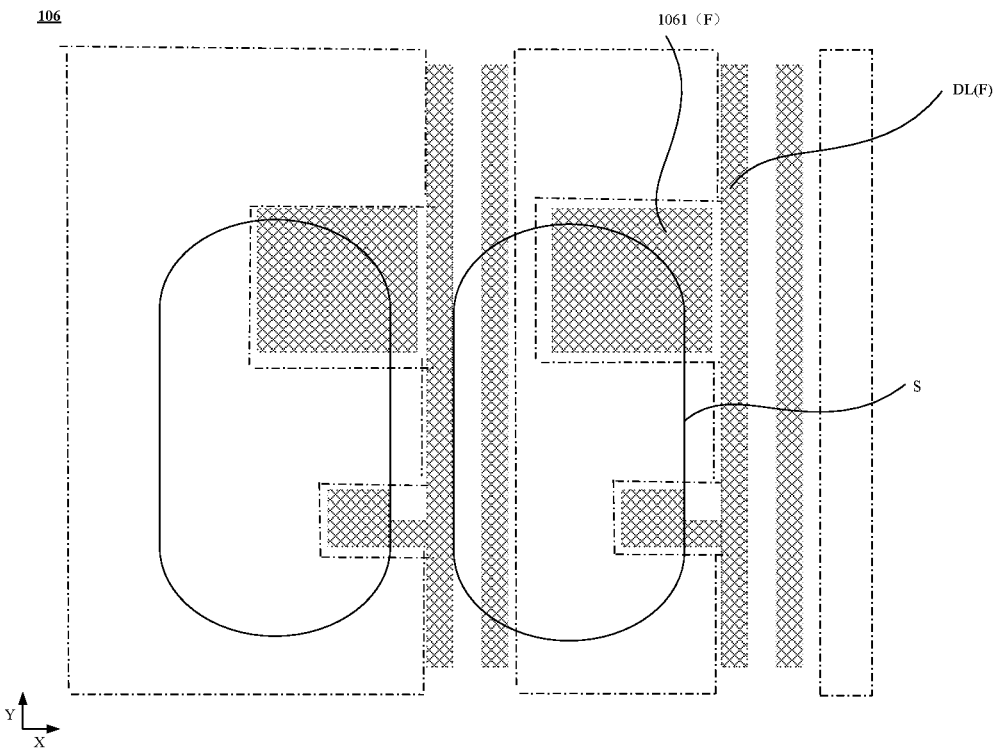
FIG. 13 is a partial plan view of yet another functional layer in an array substrate, in accordance with some embodiments.

As shown in FIG. 9, the functional layer(s) 10 include the semiconductor layer 102, and the plurality of functional patterns F include the active layers of the plurality of thin film transistors. And/or, as shown in FIG. 10, the functional layer(s) 10 include the gate metal layer 104, and the plurality of functional patterns F include the plurality of gate lines GL and the gates of the plurality of thin film transistors T. And/or, as shown in FIG. 13, the functional layer(s) 10 include the source-drain metal layer 106, and the plurality of functional patterns F include the plurality of data lines DL, and the sources and the drains of the plurality of thin film transistors T. Moreover, as shown in FIG. 7, the functional layer(s) 10 further include the light-shielding metal layer 108, and the plurality of functional patterns F include the plurality of light-shielding patterns. Each light-shielding pattern corresponds to the active layer of the thin film transistor T.

In some embodiments, the at least one functional layer 10 is any one or a combination of at least two of the semiconductor layer 102, the gate metal layer 104, the source-drain metal layer 106 and the light-shielding metal layer 108.

For example, the functional layer 10 is the semiconductor layer 102. Or, the functional layer 10 is the gate metal layer 104. Or, the functional layer 10 is the source-drain metal layer 106. Or, the functional layer 10 is the light-shielding metal layer 108.

For example, the functional layers 10 include the semiconductor layer 102 and the gate metal layer 104. Or, the functional layers 10 include the semiconductor layer 102 and the source-drain metal layer 106. Or, the functional layers 10 include the gate metal layer 104 and the source-drain metal layer 106. Or, the functional layers 10 include the gate metal layer 104 and the light-shielding metal layer 108.

For example, the functional layers 10 include the semiconductor layer 102, the gate metal layer 104, and the source-drain metal layer 106. Or, the functional layers 10 include the semiconductor layer 102, the gate metal layer 104, and the light-shielding metal layer 108. Or, the functional layers 10 include the semiconductor layer 102, the source-drain metal layer 106 and the light-shielding metal layer 108. Or, the functional layers 10 include the gate metal layer 104, the source-drain metal layer 106 and the light-shielding metal layer 108.

For example, the functional layers 10 include the semiconductor layer 102, the gate metal layer 104, the source-drain metal layer 106, and the light-shielding metal layer 108.

In the array substrate 100, the at least one supplementary pattern R is disposed in the functional layer 10, and at least one supplementary pattern R is disposed in the gap region K between the plurality of functional patterns F. Moreover, at least one supplementary pattern R is located in at least one opening region S, the plurality of functional patterns F and the at least one supplementary pattern R are spaced apart from each other, and the plurality of functional patterns F and the at least one supplementary pattern R are arranged at substantially equal intervals. In this way, on a premise of not affecting an original function of each functional pattern F in the functional layer 10, at least in the opening region S, the gap region K between the plurality of functional patterns F is filled with the supplementary pattern R, so that an arrangement uniformity of the patterns in the functional layer 10 may be improved, thereby improving the unevenness of the planarization layer 107 caused by a non-uniform sparsity of the functional patterns F in each region. At least in a portion of the planarization layer 107 corresponding to the opening region S, the flatness of the planarization layer 107 is improved, so that the flatness of each film layer in the light-emitting device disposed on the portion of the planarization layer 107 is also improved, and thus, the operating effect of the driving device is improved, for example, the luminous uniformity of the light-emitting device is improved.

Figure 12:
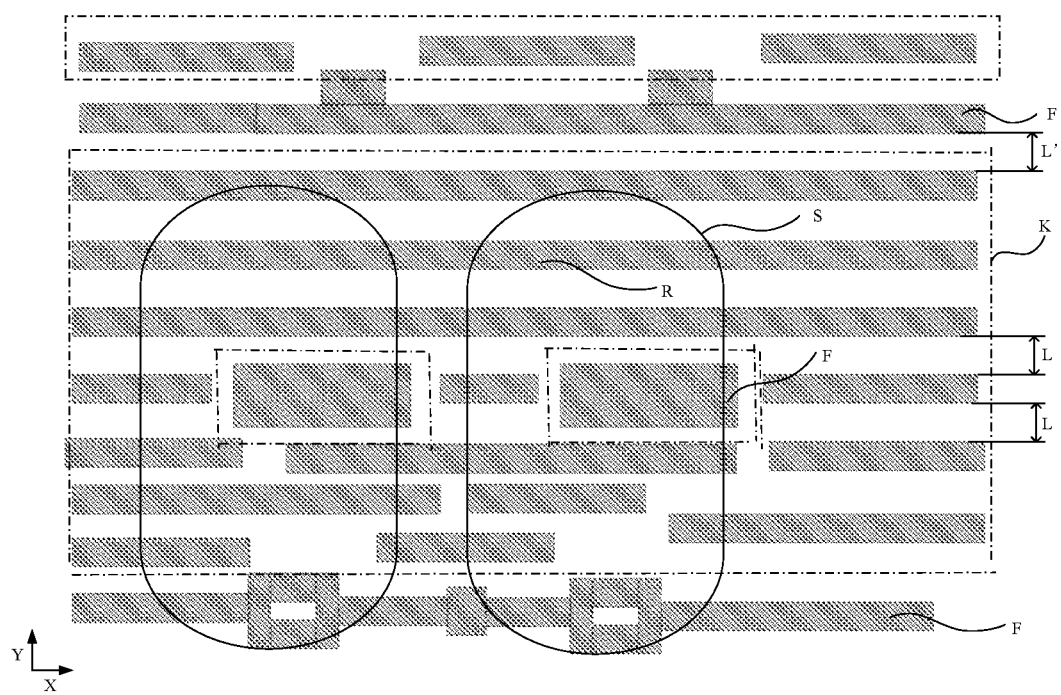
FIG. 12 is a partial plan view of yet another functional layer in an array substrate, in accordance with some embodiments.

In some embodiments, as shown in FIG. 12, at least one supplementary pattern R is further disposed in a region other than the plurality of opening regions S. That is, the sub-region non-overlapped with the opening region S in the gap region K between the plurality of functional patterns F is also provided with at least one supplementary pattern R.

Thus, the sub-regions in the gap region K between the plurality of functional patterns F are all provided with at least one supplementary pattern R, so that the plurality of functional patterns F and the plurality of supplementary patterns R are more uniformly distributed in the whole functional layer 10, thereby further improving the flatness of the planarization layer 107, and further improving the operating effect of the driving device.

In the embodiments of the present disclosure, at least one functional layer 10 may be provided with supplementary pattern(s) R. Specific arrangements of the supplementary pattern(s) will be introduced below.

As shown in FIGS. 10 to 16, a structure of each functional layer 10 is introduced in an example where the functional layer(s) 10 are the gate metal layer 104 and/or the source-drain metal layer 106. For example, a partial view of film layer(s) in each of FIGS. 10 to 16 corresponds to a region (i.e., two sub-pixel regions P') where two adjacent sub-pixels P in FIG. 8A are located.

As shown in FIG. 10, in a case where the functional layer 10 is the gate metal layer 104, the plurality of functional patterns F further include bridges 1044 for electrically connecting other structures and circuit compensation lines 1045 in addition to the gate lines GL and the gates of the plurality of the thin film transistors T. The plurality of functional patterns F are unevenly and sparsely distributed. The bridge 1044 and the gate line 1043 have the gap region K therebetween, and the bridge 1044 and the circuit compensation line 1045 have the gap region K therebetween.

As shown in FIG. 13, in a case where the functional layer 10 is the source-drain metal layer 106, the plurality of functional patterns F further include electrode plates 1061 of the capacitors in addition to the plurality of data lines DL, and the sources and drains of the plurality of the thin film transistors T. The plurality of functional patterns F are unevenly and sparsely distributed. The data lines DL corresponding to different sub-pixels have the gap region K therebetween.

It will be noted that FIGS. 10 and 13 are schematic diagrams of the functional patterns F included in the functional layer 10 without the supplementary pattern R. In FIGS. 11, 12 and 14 to 16, other patterns except for the functional patterns F are the supplementary patterns R.

In some embodiments, the gap region K between two adjacent functional patterns F is provided with the supplementary pattern R, and intervals between the supplementary pattern R and the functional patterns F located on two sides of the supplementary pattern R are substantially equal.

Figure 11:
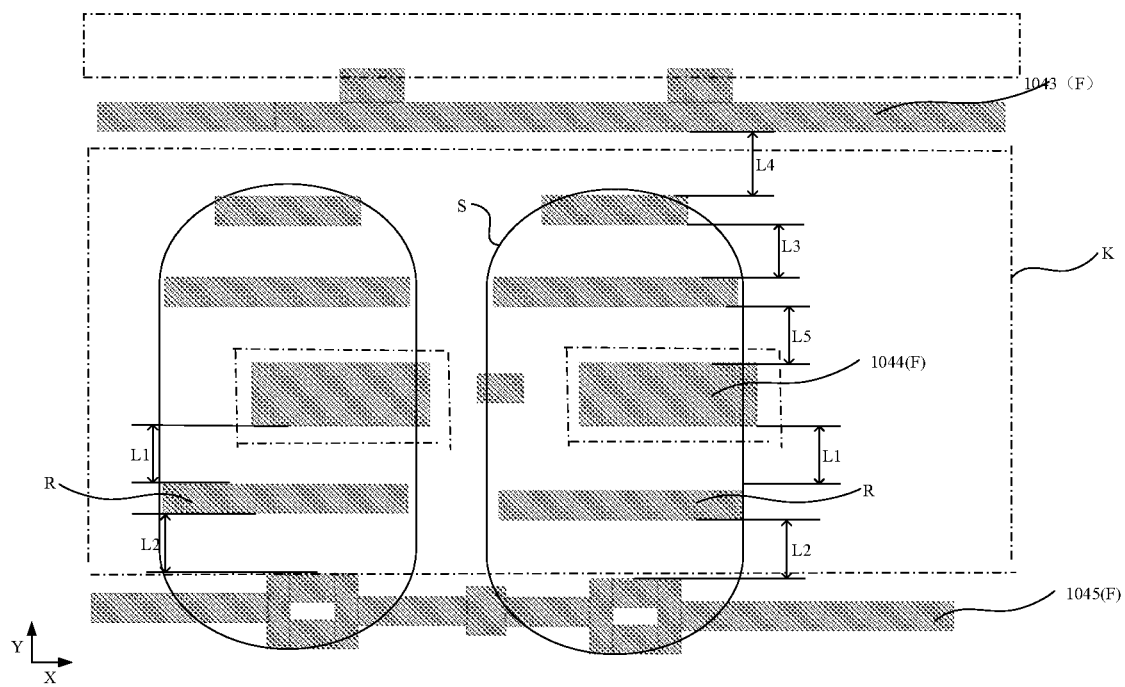
FIG. 11 is a partial plan view of yet another functional layer in an array substrate, in accordance with some embodiments.

For example, as shown in FIG. 11, the supplementary pattern R is provided between the bridge 1044 and the circuit compensation line 1045 that are adjacent to each other. In the second direction Y, an interval L1 between the supplementary pattern and the bridge 1044 is substantially equal to an interval L2 between the supplementary pattern and the circuit compensation line 1045.

In some other embodiments, the gap region between two adjacent functional patterns F is provided with a plurality of supplementary patterns R, and the plurality of supplementary patterns R are arranged at substantially equal intervals. An interval between the functional pattern F and the supplementary pattern R that are adjacent to each other is substantially equal to an interval between two adjacent supplementary patterns R.

For example, as shown in FIG. 11, two supplementary patterns R are provided between the bridge 1044 and the gate line 1043 that are adjacent to each other. In the second direction Y, an interval L3 between the two supplementary patterns R, an interval L4 between the supplementary pattern R and the gate line 1043 that are adjacent to each other, and an interval L5 between the supplementary pattern R and the bridge 1044 that are adjacent to each other are substantially equal.

By such arrangement, the arrangement uniformity of the functional patterns F and the supplementary patterns R included in the functional layer 10 may be further improved, so that when the planarization layer 107 is subsequently manufactured on the at least one functional layer 10, the flatness of the planarization layer 107 may be further improved, and the surface of the planarization layer 107 is flatter.

In some examples, the plurality of functional patterns and the at least one supplementary pattern are arranged at substantially equal intervals in the first direction X and/or the second direction Y along a plane where the base 101 is located.

Figure 14:
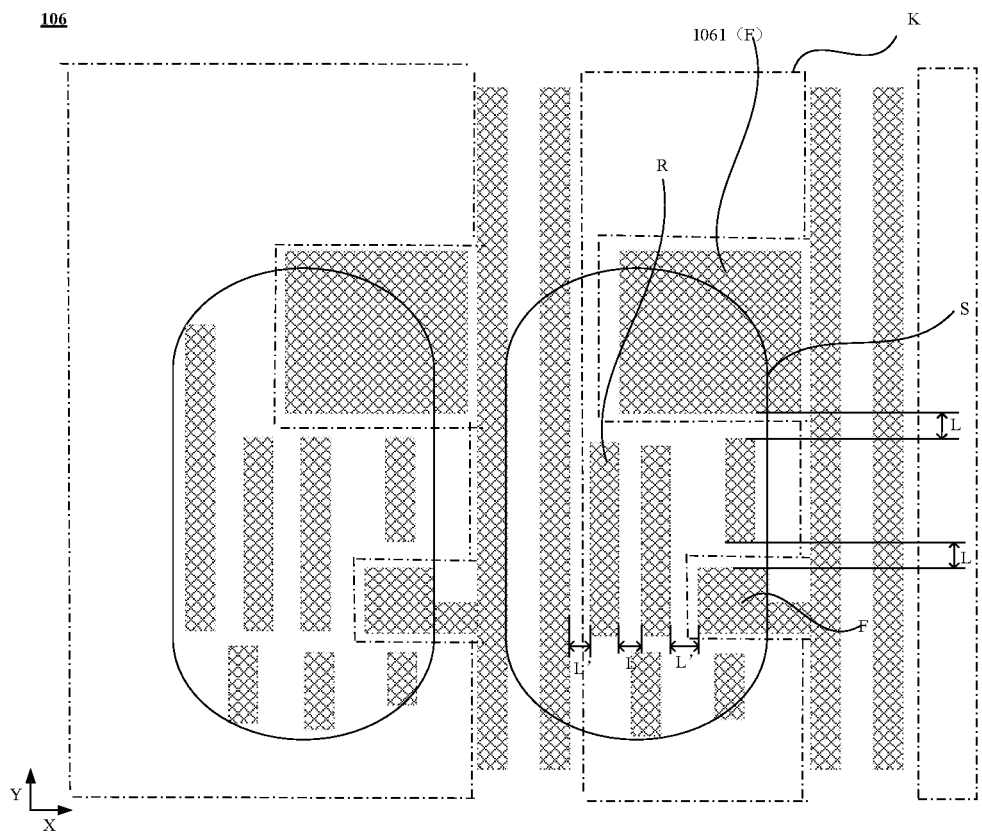
FIG. 14 is a partial plan view of yet another functional layer in an array substrate, in accordance with some embodiments.

For example, as shown in FIG. 12, in the gate metal layer 104, the plurality of functional patterns F and the at least one supplementary pattern R are arranged at substantially equal intervals in the second direction Y. For example, in the second direction Y, an interval L between two adjacent supplementary patterns R is equal to an interval L' between the supplementary pattern R and the functional pattern F that are adjacent to each other. As shown in FIG. 14, in the source-drain metal layer 106, the plurality of functional patterns F and the at least one supplementary pattern R are arranged at substantially equal intervals in the first direction X. For example, in the first direction X, an interval L between two adjacent supplementary patterns R is equal to an interval L' between the supplementary pattern R and the functional pattern F that are adjacent to each other.

In some embodiments, a plurality of supplementary patterns are included in each functional layer 10. Shapes and arrangements of the supplementary patterns R are as follows. The plurality of functional patterns F are each in a long strip shape, and the supplementary patterns R are each in the long strip shape. The plurality of functional patterns F and the plurality of the supplementary patterns R all extend in the first direction X, and the plurality of functional patterns and the plurality of the supplementary patterns are arranged at substantially equal intervals in the second direction Y. Or, the plurality of functional patterns and the plurality of the supplementary patterns all extend in the second direction Y, and the plurality of functional patterns and the plurality of the supplementary patterns are arranged at substantially equal intervals in the first direction X.

For example, as shown in FIG. 12, the functional layer 10 is the gate metal layer 104, and the gate metal layer 104 includes the plurality of functional patterns F and the plurality of supplementary patterns R. The plurality of supplementary patterns R are located in the gap region K between the plurality of functional patterns F.

The plurality of functional patterns F and the supplementary patterns R are each in the long strip shape. The plurality of functional patterns F and the plurality of supplementary patterns R all extend in the first direction X. In the second direction Y, the plurality of functional patterns F and the plurality of supplementary patterns R are arranged at substantially equal intervals.

Figure 15:
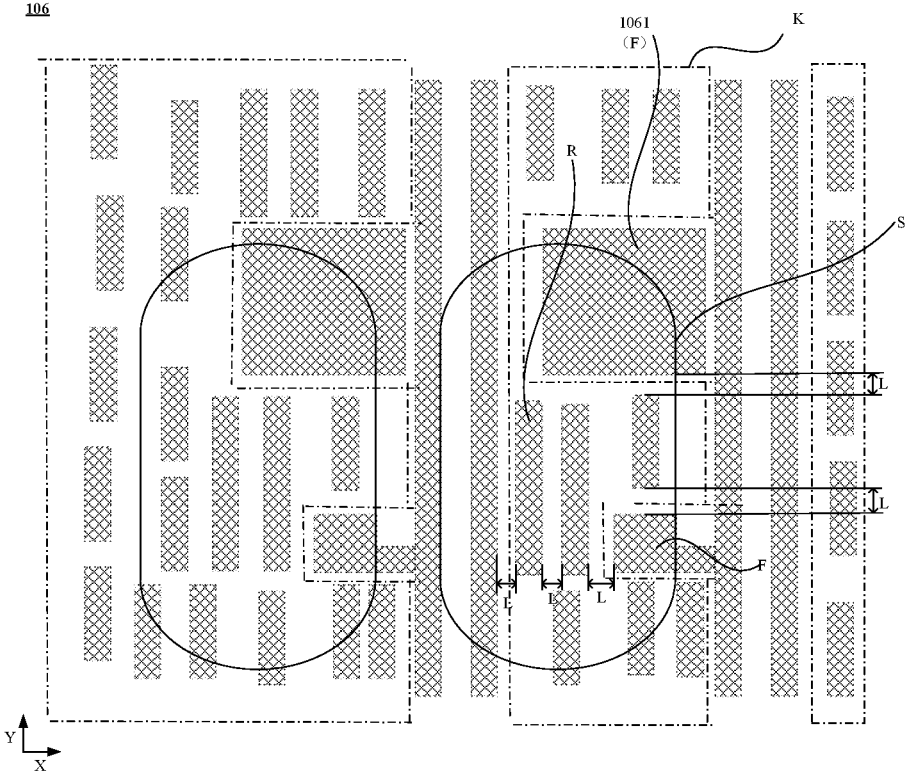
FIG. 15 is a partial plan view of yet another functional layer in an array substrate, in accordance with some embodiments.

For example, as shown in FIG. 15, the functional layer 10 is the source-drain metal layer 106. The source-drain metal layer 106 includes the plurality of functional patterns F and the plurality of supplementary patterns R. The plurality of supplementary patterns R are located in the gap regions K between the plurality of functional patterns F.

The plurality of functional patterns F and the supplementary patterns R are each in the long strip shape. The plurality of functional patterns F and the plurality of supplementary patterns R all extend in the second direction Y. In the first direction X, the plurality of functional patterns F and the plurality of supplementary patterns R are arranged at substantially equal intervals.

The first direction and the second direction Y intersect. For example, an included angle of the first direction X and the second direction Y is 90 degrees.

In some embodiments, the supplementary pattern R is in any one of the long strip shape, a circular shape and a rhombic shape. For example, the shape of the supplementary pattern R is consistent with that of the functional pattern F.

As shown in FIGS. 11, 12, and 14 to 16, in a case where the supplementary pattern R is in the long strip shape, a width of the supplementary pattern R is same as a width of the functional pattern F. Or, the width of the supplementary pattern R is an average width of the plurality of functional patterns F. A specific value of the width may be set according to application scenario.

In some embodiments, a numerical range of the interval between two adjacent supplementary patterns R and an numerical range of the interval between the functional pattern F and the supplementary pattern R that are adjacent to each other are required to be set in consideration of the difficulty of a manufacturing process and an improvement degree of the flatness of the planarization layer. In some examples, the numerical range of the interval between the functional pattern F and the supplementary pattern R that are adjacent to each other is 4 µm to 10 µm. For example, the interval between the functional pattern F and the supplementary pattern R that are adjacent to each other is 4 µm, 8 µm, or 10 µm. In some other examples, in a case where the functional layer includes the plurality of supplementary patterns R, the numerical range of the interval between two adjacent supplementary patterns R is 4 µm to 10 µm. For example, the interval between two adjacent supplementary patterns R is 4 µm, 8 µm, or 10 µm. In this way, the surface of the planarization layer may be flatter by such arrangement.

In some embodiments, the plurality of functional patterns F and the at least one supplementary pattern R are made of a same material. For example, in a case where the functional layer(s) 10 are the gate metal layer 104 and/or the source-drain metal layer 106, the plurality of functional patterns F and the at least one supplementary pattern R are made of a metal, such as copper, aluminum or a copper-aluminum alloy. In a case where the functional layer 10 is the semiconductor layer 102, the plurality of functional patterns F and the at least one supplementary pattern R are made of a semiconductor, such as silicon.

In this way, the plurality of functional patterns F and the at least one supplementary pattern R are arranged in a same layer, and are made of a same material, and thus in the manufacturing process of the array substrate 100, a film layer may be formed by using a same film formation process, and then is patterned by using an etching process to form corresponding patterns, so that the plurality of functional patterns F and the supplementary patterns R are obtained synchronously, thereby simplifying the process and reducing the difficulty of manufacturing the array substrate 100.

Further, in the direction perpendicular to the base 101, the thickness of the functional pattern F is equal to the thickness of the supplementary pattern R, so that the plurality of functional patterns F and the at least one supplementary pattern R may be manufactured by using a same manufacturing process, thereby simplifying manufacturing steps and ensuring the surface flatness of the planarization layer 107 that is subsequently manufactured.

In some embodiments, as shown in FIGS. 13 to 15, in the case where the functional layer 10 is the source-drain metal layer 106, an arrangement method of the plurality of functional patterns F and the at least one supplementary pattern R is same as that of the above embodiments, which will not be repeated here.

Figure 16:
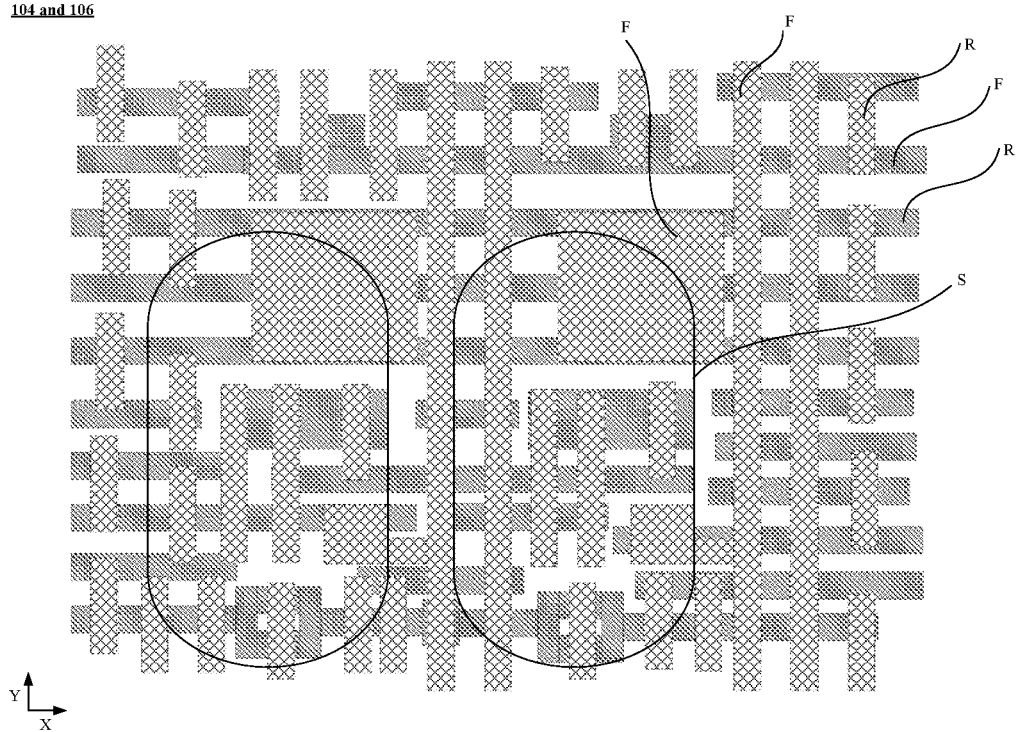
FIG. 16 is a partial plan view of at least one functional layer in an array substrate, in accordance with some embodiments.

In some embodiments, the planarization layer 107 is required to be manufactured on the gate metal layer 104 or the source-drain metal layer 106. In this case, the base before planarization may be subjected to a homogenization treatment in a modified manner of FIG. 11, FIG. 12, FIG. 14 or FIG. 15. Or, in a case where the planarization layer 107 is manufactured on the gate metal layer 104 and the source-drain metal layer 106 that are stacked, the base with a uniform sparsity is obtained through the supplementary pattern(s) R of FIG. 11, FIG. 12, FIG. 14 or FIG. 15, and a schematic diagram of the gate metal layer 104 and the source-drain metal layer 106 that are finally stacked is as shown in FIG. 16.

It will be noted that in a case where the plurality of functional patterns F are each in the long strip shape, and extending directions of the plurality of functional patterns F along the plane where the base 101 is located are different, when the supplementary patterns R are arranged, the supplementary patterns R with different extending directions may be used. For example, the functional pattern F extends in the first direction X, the supplementary pattern R is provided to extend in the first direction X. And/or, the functional pattern F extends in the second direction Y, the supplementary pattern R is provided to extend in the second direction Y. A specific arrangement of may be set according to the extending direction of the functional pattern F and a distance relationship between each functional pattern F and its adjacent functional pattern F. Moreover, in this arrangement, the supplementary pattern R may be provided in a region other than the opening regions S.

Some embodiments of the present disclosure provide another solution to design the patterns of the functional layer 10, so as to improve the flatness of the planarization layer 107.

Figure 17:
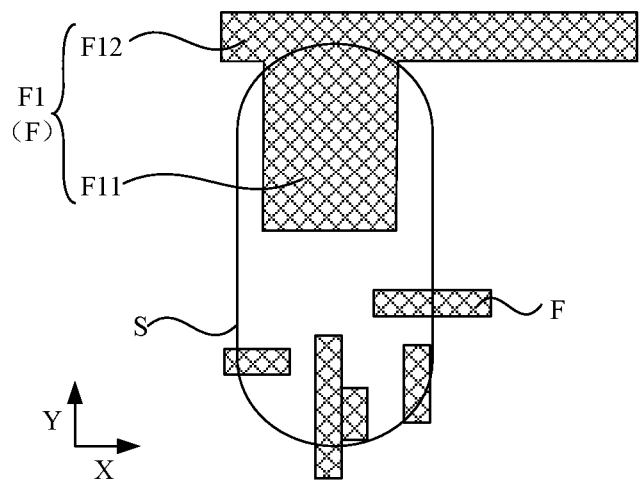
FIG. 17 is a partial plan view of a functional layer in an array substrate, in accordance with some other embodiments.
Figure 21:
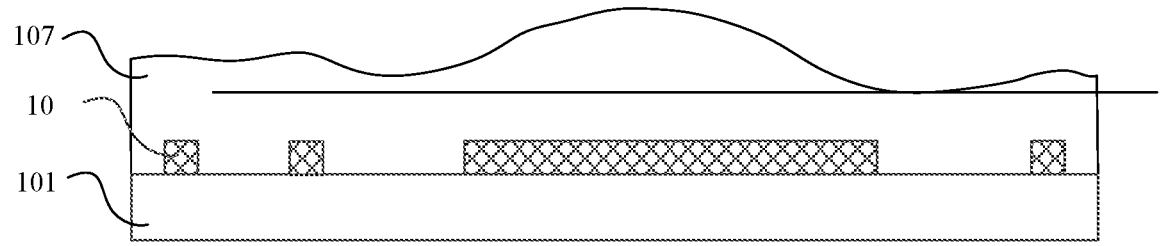
FIG. 21 is a sectional view of an array substrate coated with a planarization layer, in accordance with some embodiments.

Referring to FIGS. 17 and 21, the plurality of functional patterns F included in the functional layer 10 include at least one first functional pattern F1. An area of the first functional pattern F1 is greater than an area of other functional pattern F, and the first functional pattern F1 is blocky. When the material of the planarization layer 107 is coated on the functional layer 10, the material of the planarization layer accumulated on the first functional pattern F1 is much more than the material of the planarization layer accumulated on other functional pattern F with a smaller area. Thus, a highest point of the formed planarization layer 107 is located at the first functional pattern F1, for example, a high protrusion is formed above a center of the first functional pattern F1, and a lowest point is located in the gap region around the first functional pattern F1, which forms a depression.

Figure 18:
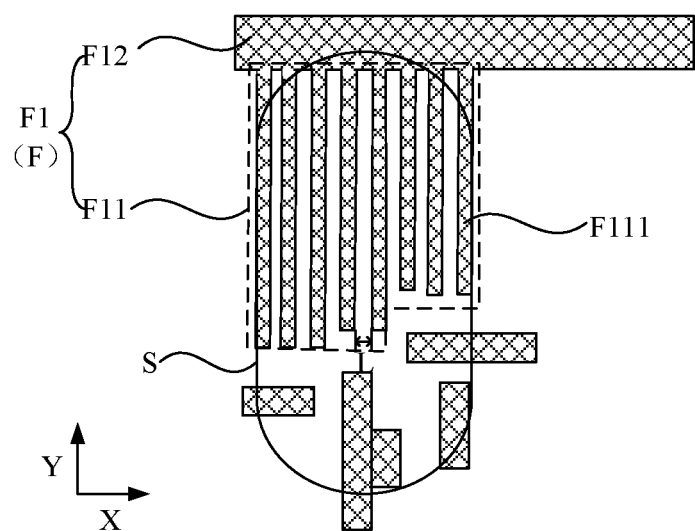
FIG. 18 is a partial plan view of another functional layer in an array substrate, in accordance with some other embodiments.

Referring to FIG. 17 and FIG. 18, the first functional pattern F1 includes a first portion F11 in the opening region S and a second portion F12 outside the opening region S. That is, a portion of the first functional pattern F1 is in the opening region S. As shown in FIG. 18, the first portion F11 includes a plurality of strip-shaped sub-patterns F111. The first portion F11 has a wire grid shape, and an end of each of the plurality of strip-shaped sub-patterns F111 is connected to the second portion F12.

The plurality of strip-shaped sub-patterns F111 are parallel to each other and arranged at substantially equal intervals. For example, the plurality of strip-shaped sub-patterns F111 extend in the second direction Y, and in the first direction X, an interval between two adjacent strip-shaped sub-patterns F111 is equal.

In some embodiments, a numerical range of the interval L between two adjacent strip-shaped sub-patterns F111 is 4 µm to 10 µm. For example, the interval L between two adjacent strip-shaped sub-patterns F111 is 4 µm, 8 µm, or 10 µm. "Arranged at substantially equal intervals" means that the intervals between the plurality of strip-shaped sub-patterns are all within a range of 4 µm to 10 µm, but is not limited to that the interval between two adjacent strip-shaped sub-patterns is equal.

Figure 22:
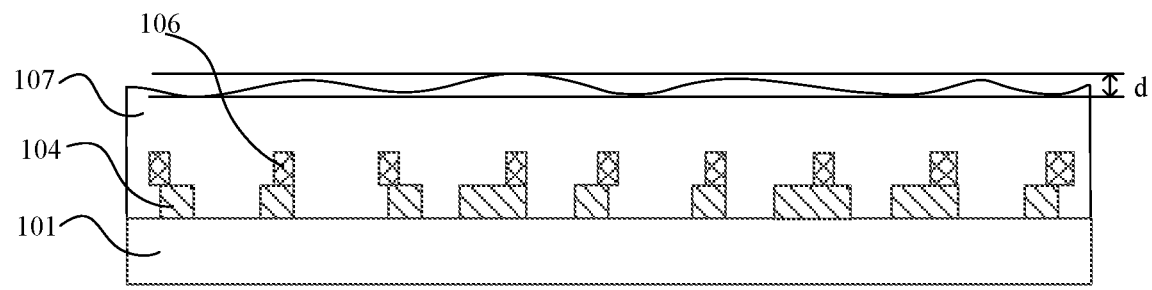
FIG. 22 is a sectional view of another array substrate coated with a planarization layer, in accordance with some embodiments.

Compared with the prior art, the plurality of strip-shaped sub-patterns F111 are designed in the embodiments of the present disclosure. The first portion F11 is provided to include the plurality of strip-shaped sub-patterns F111, and the second portion F12 is unchanged, so as to realize the electrical connection. After the material of the planarization layer is coated, a plurality of small wavy fluctuations are formed, thereby preventing the material of the planarization layer from being concentrated at a position. As shown in FIG. 22, a maximum level difference d generated by the plurality of small wavy fluctuations is reduced, which improves the uneven planarization layer 107, and improves the flatness of the planarization layer 107, and thus, the operating effect of the driving device in the electronic device 01 is improved, for example, the luminous uniformity of the light-emitting device is improved.

It can be understood that the lengths of the plurality of strip-shaped sub-patterns F111 may be or may not be equal, which are adjusted according to a size of the gap region K between the plurality of functional patterns F, so as to ensure that a numerical range of an interval between each strip-shaped sub-pattern F111 and an adjacent functional pattern F is 4 µm to 10 µm.

The widths of the plurality of strip-shaped sub-patterns F111 may be or may not be equal. In some examples, the width of the strip-shaped sub-pattern F111 is less than 20 µm. Further, in a case where the interval between two adjacent functional patterns F is greater than 20 µm, it is required to provide the supplementary pattern(s) R.

Figure 19:
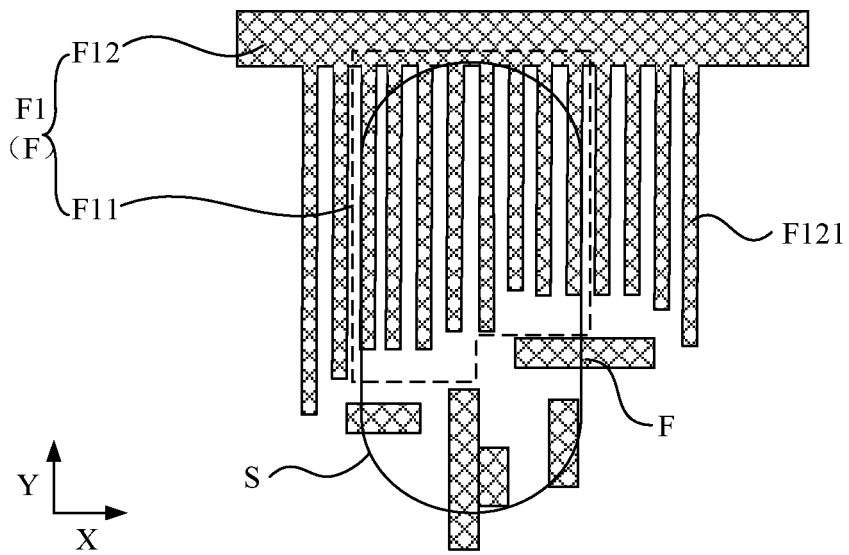
FIG. 19 is a partial plan view of yet another functional layer in an array substrate, in accordance with some other embodiments.

In some embodiments, as shown in FIG. 19, a portion of the second portion F12 of the first functional pattern F1 outside the opening region S may also be designed to be in a wire grid shape. The second portion F12 also includes a plurality of strip-shaped sub-structures F121, so that the coated material of the planarization layer may be dispersed more uniformly, which further prevents the material of the planarization layer from being concentrated on the blocky pattern with a large area, and further improves the flatness of the planarization layer 107.

In some examples, a specific design of the plurality of strip-shaped sub-structures F121 of the second portion F12 may be referred to the specific design of the plurality of strip-shaped sub-patterns F111 of the first portion F11, which will not be repeated herein.

In summary, in the above embodiments of the present disclosure, according to a coating mechanism of the planarization layer 107 and characteristics of the functional patterns F included in the functional layer 10, some methods of improving the flatness of the planarization layer 107 are provided. One of the methods is to improve the flatness of the planarization layer 107 by providing the at least one supplementary pattern R in the gap region K between the plurality of the functional patterns F to improve the uniformity of all the patterns included in the functional layer 10. Another method is to improve the flatness of the planarization layer 107 by designing the first portion F11 of the functional pattern F with a large area in the opening region S into the plurality of strip-shaped sub-patterns F111 to prevent the material of the planarization layer from being concentratedly accumulated on the blocky pattern with a large area. As a possible design, the above several embodiments may be combined.

Figure 20:
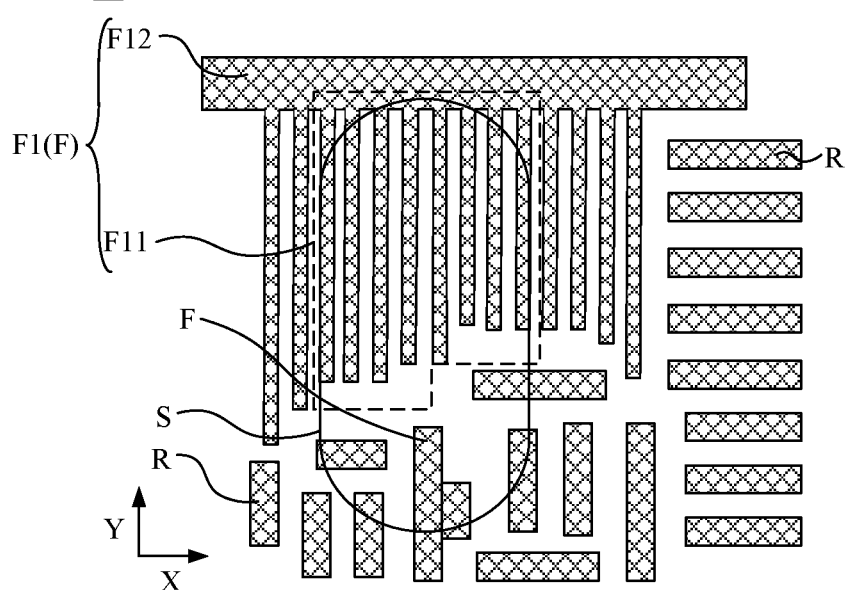
FIG. 20 is a partial plan view of yet another functional layer in an array substrate, in accordance with some other embodiments.

As shown in FIG. 20, in some embodiments, the functional layer 10 includes a plurality of functional patterns F and a plurality of supplementary patterns R, and at least one of the plurality of functional patterns F is the first functional pattern(s) F1. The supplementary patterns R are located in the gap region between the plurality of functional patterns F and in the opening regions S and a region other than the opening regions S. The first portion F11 of the first functional pattern F1 includes the plurality of strip-shaped sub-patterns F111, and an end of each of the plurality of strip-shaped sub-patterns F111 is connected to the second portion F12.

In some embodiments, the plurality of functional patterns F and the plurality of supplementary patterns R are arranged at substantially equal intervals, which includes: in the first direction X or the second direction Y, the interval between the functional pattern F and the supplementary pattern R that are adjacent to each other, the interval between two adjacent supplementary patterns R, and the interval between two adjacent strip-shaped sub-patterns F111 are substantially equal.

In this way, the sparsity of the plurality of supplementary patterns R and the plurality of functional patterns F in the whole functional layer 10 is more uniform, and no blocky functional pattern F with a large area exists in the functional layer 10, which is able to better ensure the surface flatness of the planarization layer 107 that is manufactured subsequently.

The foregoing descriptions are only preferred embodiments of the present disclosure and explanations of applied technical principles. A person skilled in the art should understand that the scope of the invention involved in the present disclosure is not limited to the technical solutions formed by the specific combinations of the above technical features, and also includes other technical solutions formed by any combinations of the above technical features or their equivalent features without departing from the inventive concept, such as technical solutions formed by mutually replacing the above features with technical features having similar functions as those (but not limited to) disclosed in the present disclosure.

What is claimed is:

1. An array substrate having a plurality of opening regions, the array substrate comprising:
   a base; and
   at least one functional layer disposed on a side of the base, a functional layer in the at least one functional layer including:
   a plurality of functional patterns configured to transmit electrical signals, a gap region existing between the plurality of functional patterns; and
   at least one supplementary pattern at least disposed in at least one opening region, a supplementary pattern in the at least one supplementary pattern being located in the gap region between the plurality of functional patterns; wherein
   the plurality of functional patterns and the at least one supplementary pattern are spaced apart from each other, and the plurality of functional patterns and the at least one supplementary pattern are arranged at substantially equal intervals.

2. The array substrate according to claim 1, wherein the at least one supplementary pattern is further disposed in a region other than the plurality of opening regions.

3. The array substrate according to claim 1, wherein one supplementary pattern is disposed in a gap region between two adjacent functional patterns, and intervals between the supplementary pattern and the functional patterns on two sides of the supplementary pattern are substantially equal.

4. The array substrate according to claim 1, wherein a plurality of supplementary patterns are disposed in a gap region between two adjacent functional patterns, and the plurality of supplementary patterns are arranged at substantially equal intervals;
   an interval between a functional pattern and a supplementary pattern that are adjacent to each other is substantially equal to an interval between two adjacent supplementary patterns.

5. The array substrate according to claim 1, wherein the plurality of functional patterns and the at least one supplementary pattern are arranged at substantially equal intervals in a first direction and/or a second direction along a plane where the base is located; wherein the first direction and the second direction intersect.

6. The array substrate according to claim 1, wherein a numerical range of an interval between a functional pattern and a supplementary pattern that are adjacent to each other is 4 µm to 10 µm.

7. The array substrate according to claim 1, wherein the plurality of functional patterns and the at least one supplementary pattern are made of a same material.

8. The array substrate according to claim 1, wherein in a direction perpendicular to the base, a thickness of each of the plurality of functional patterns is equal to a thickness of the at least one-supplementary pattern.

9. The array substrate according to claim 1, wherein the supplementary pattern is in any one of a long strip shape, a circular shape and a rhombic shape.

10. The array substrate according to claim 9, wherein a plurality of supplementary patterns exist;
    the plurality of functional patterns are each in the long strip shape, and the supplementary patterns are each in the long strip shape; and
    the plurality of functional patterns and the plurality of supplementary patterns all extend in a first direction, and in a second direction, the plurality of functional patterns and the plurality of the supplementary patterns are arranged at substantially equal intervals; or
    the plurality of functional patterns and the plurality of the supplementary patterns all extend in the second direction, and in the first direction, the plurality of functional patterns and the plurality of the supplementary patterns are arranged at substantially equal intervals; wherein the first direction and the second direction intersect along a plane where the base is located.

11. The array substrate according to claim 1, wherein the plurality of functional patterns include at least one first functional pattern, and a first functional pattern in the at least one first functional pattern includes:
- a first portion in an opening region in the plurality of opening regions, the first portion including a plurality of strip-shaped sub-patterns; and
- a second portion outside the opening region, an end of each of the plurality of strip-shaped sub-patterns being connected to the second portion.

12. The array substrate according to claim 11, wherein the plurality of strip-shaped sub-patterns are parallel to each other and arranged at equal intervals.

13. The array substrate according to claim 12, wherein a numerical range of an interval between two adjacent strip-shaped sub-patterns is 4 μm to 10 μm.

14. The array substrate according to claim 1, comprising:
- a semiconductor layer disposed on the side of the base, the semiconductor layer including active layers of a plurality of thin film transistors;
- a gate insulating layer disposed on a side of the semiconductor layer away from the base;
- a gate metal layer disposed on a side of the gate insulating layer away from the base, the gate metal layer including a plurality of gate lines and gates of the plurality of thin film transistors;
- an interlayer insulating layer disposed on a side of the gate metal layer away from the base;
- a source-drain metal layer disposed on a side of the interlayer insulating layer away from the base, the source-drain metal layer including a plurality of data lines, and sources and drains of the plurality of thin film transistors;

wherein the at least one functional layer includes the semiconductor layer, and the plurality of functional patterns include the active layers of the plurality of thin film transistors; and/or the at least one functional layer includes the gate metal layer, and the plurality of functional patterns include the plurality of gate lines and the gates of the plurality of thin film transistors; and/or the at least one functional layer includes the source-drain metal layer, and the plurality of functional patterns include the plurality of data lines, and the sources and drains of the plurality of thin film transistors.

15. The array substrate according to claim 14, comprising:
- a light-shielding metal layer and a first insulating layer that are disposed between the base and the semiconductor layer, the light-shielding metal layer being closer to the base than the first insulating layer; wherein
- the light-shielding metal layer includes a plurality of light-shielding patterns, and each light-shielding pattern corresponds to the active layer in the active layers;
- the at least one functional layer further includes the light-shielding metal layer, and the plurality of functional patterns include the plurality of light-shielding patterns.

16. An electronic device substrate, comprising:
- the array substrate according to claim 1;
- a plurality of driving devices disposed on the array substrate, each driving device including a first electrode, a driving layer and a second electrode that are stacked; wherein
- an orthographic projection of the driving layer in each driving device on the base is within an opening region in the plurality of opening regions.

17. The electronic device substrate according to claim 16, wherein the driving device includes a light-emitting device, and the driving layer includes a light-emitting layer;
or, the driving device includes a photoelectric conversion device, and the driving layer includes a photoelectric conversion layer.

18. An electronic device, comprising the electronic device substrate according to claim 16.

19. The array substrate according to claim 1, wherein the functional layer includes a plurality of supplementary patterns, and a numerical range of an interval between two adjacent supplementary patterns is 4 μm to 10 μm.

* * * * *